United States Patent
Lopez et al.

(10) Patent No.: US 8,975,658 B2
(45) Date of Patent: Mar. 10, 2015

(54) SHUNTING LAYER ARRANGEMENT FOR LEDS

(75) Inventors: Toni Lopez, Kelmis (BE); Rafael Ignacio Aldaz, Pleasanton, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/812,587

(22) PCT Filed: Jul. 25, 2011

(86) PCT No.: PCT/IB2011/053304
§ 371 (c)(1),
(2), (4) Date: Jan. 28, 2013

(87) PCT Pub. No.: WO2012/020346
PCT Pub. Date: Feb. 16, 2012

(65) Prior Publication Data
US 2013/0187193 A1 Jul. 25, 2013

Related U.S. Application Data

(60) Provisional application No. 61/371,944, filed on Aug. 10, 2010.

(51) Int. Cl.
*H01L 33/00* (2010.01)
*H01L 33/38* (2010.01)
*H01L 33/20* (2010.01)
*H01L 33/40* (2010.01)
*H01L 33/46* (2010.01)

(52) U.S. Cl.
CPC .............. *H01L 33/387* (2013.01); *H01L 33/20* (2013.01); *H01L 33/38* (2013.01); *H01L 33/405* (2013.01); *H01L 33/46* (2013.01)
USPC ................................... 257/99; 237/91; 237/95

(58) Field of Classification Search
CPC combination set(s) only.
See application file for complete search history.

(56) References Cited

U.S. PATENT DOCUMENTS

| | | | |
|---|---|---|---|
| 2004/0065891 A1* | 4/2004 | Shakuda et al. | 257/99 |
| 2005/0023543 A1 | 2/2005 | Konno | |
| 2005/0224823 A1 | 10/2005 | Zhao et al. | |
| 2006/0091786 A1* | 5/2006 | Chakraborty et al. | 313/500 |
| 2008/0246047 A1* | 10/2008 | Hsu et al. | 257/98 |
| 2009/0072257 A1* | 3/2009 | Unno et al. | 257/98 |
| 2009/0212307 A1* | 8/2009 | Baur et al. | 257/98 |
| 2010/0140656 A1 | 6/2010 | Kim et al. | |

* cited by examiner

*Primary Examiner* — David Vu
*Assistant Examiner* — Mouloucoulaye Inoussa

(57) ABSTRACT

A shunting pattern on a surface of an LED die comprises an array of metal dots having widths that are on the order of 2Lt-5Lt (where Lt is transfer length) so as not to block a significant amount of light, yet have low contact resistance to the semiconductor current spreading layer. Contact resistance is not significantly reduced with widths greater than 2Lt. Each dot represents a current injection area. For a minimum 2Lt width and 50 square dots per mm2, the top surface area of an LED die will have about 1% of its surface covered by the dots. To cause the current to be evenly distributed over the top surface of the LED, the dots are connected with a grid of very thin metal connectors, having widths much less than 2Lt. In one embodiment, a wire bond electrode is formed near the middle of the top surface of the LED to create a more uniform current distribution.

19 Claims, 4 Drawing Sheets

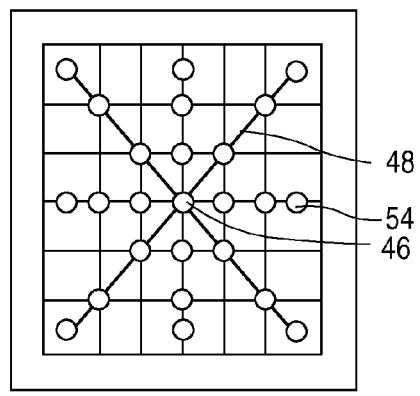
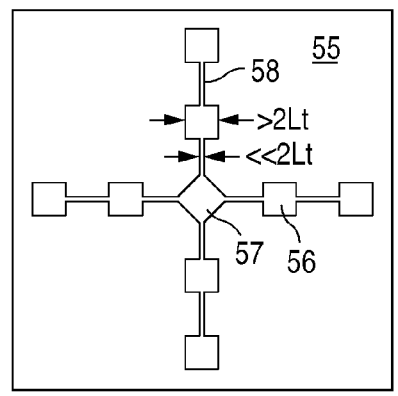
FIG. 8     FIG. 9
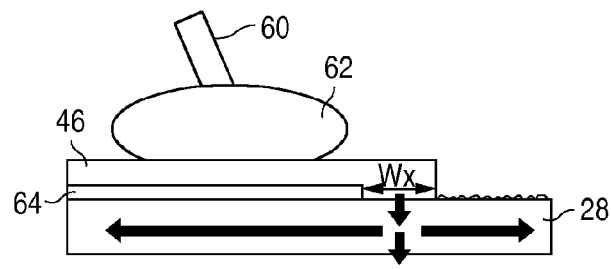
FIG. 10
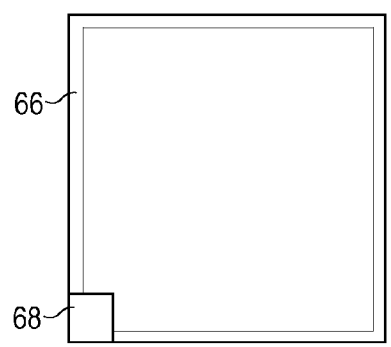
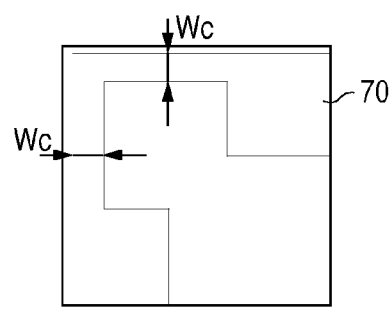
FIG. 12     FIG. 13
(PRIOR ART)

SHUNTING LAYER ARRANGEMENT FOR LEDS

FIELD OF THE INVENTION

This invention relates to light emitting diodes (LEDs) and, in particular, to a patterned metal layer on the light emitting surface LED die that improves current distribution yet does not increase light blockage.

BACKGROUND

Prior art FIG. 1 is a top down view of an LED die 10, and FIG. 2 is a simplified cross-sectional view of the LED 10 along line 2-2 in FIG. 1. In the example, the LED die 10 is GaN based and has its growth substrate removed. The structure is well known. A bottom metal anode electrode 12 is typically bonded directly to a submount pad or to a circuit board. A metal reflector 14 over the electrode 12 reflects light upward. The LED's epitaxially-grown semiconductor layers include a first p-type layer 16, a p-type cladding layer 18, an active layer 20, an n-type cladding layer 22, a first n-type layer 24, and a second n-type layer 26. The various p and n-type layers that interface between the cladding layers and the metal contacts may have different doping amounts and different compositions to achieve different functions such as lattice matching and current spreading. There may be many more layers. The semiconductor layers are transparent.

A transparent current spreading layer 28 is formed over the second n-type layer 26, and a metal cathode electrode 30 is electrically connected to an edge of the current spreading layer 28. A wire (not shown) is bonded to the cathode electrode 30. The current-spreading layer material is selected for low optical loss, low resistivity, and good electrical contact. Suitable materials for the current-spreading layer 28 include are Indium Tin Oxide, Zinc Oxide, or other transparent conducting oxides. The current spreading layer 28 is only a few microns thick so has a low vertical resistance and a much higher lateral resistance. It is important that the current distribution over the p-type cladding layer 18 and n-type cladding layer 22 is fairly uniform to achieve uniform light generation across the active layer 20.

To compensate for the relatively high lateral resistance of the current spreading layer 28, a low-resistance metal shunting layer 32 is patterned to extend across the current spreading layer 28 yet block only a small amount of light. There is a tradeoff between minimizing current crowding and minimizing light blockage. The shunting pattern shown in FIG. 1 is typical, with metal bus bars along the periphery of the die 10 and perpendicular metal bus bars connecting them. These shunting strips are formed very narrow to minimize light blockage.

FIG. 2 shows the current flow through the LED die 10 with thick arrows 36 and some photon trajectories with thin arrows 38. A simplified emitted light pattern 39 is also shown.

The top surface of the LED die 10 is roughened to increase light extraction.

One problem with the conventional shunting designs is that the thin shunting strips exhibit a contact resistance at the interface of the strips and the current spreading layer 28, where the contact resistance is directly related to the width of the strips.

For the particular case of a patterned shunting layer characterized by bus bars as shown in FIG. 1, the contact resistance of one of the three inner crossing bus bars may be expressed as, $$R_{C(ric)} = \frac{R_s}{2L} L_t \cdot \coth\left(\frac{w}{2L_t}\right) \quad \text{eq. 1}$$

where resistance $R_s$ is the sheet resistance (in $\Omega/\square$) of the current spreading layer 28, L is the length of the bus bar section, w is the width of the bus bar, and $L_t$ is the transfer length, expressed in unit length. The transfer length is defined as, $$L_t = \sqrt{\frac{\rho_c}{R_s}} \quad \text{eq. 2}$$

where $\rho_c$ is the contact resistivity of the metal-semiconductor interface, expressed in $\Omega \cdot m^2$.

As is well known, lateral current between a conductive layer and a metal contact is not uniform across the contact. The voltage is highest near the edge of the contact and drops substantially exponentially with distance. The 1/e distance of the voltage curve is another way to determine transfer length.

FIG. 3 represents the above contact resistance expression normalized against $R_s$ as function of the normalized quantity $w/L_t$ for the case of $L=L_t$. The curve indicates that for contact widths smaller than $2L_t$, the contact resistance increases inversely proportional to w, as $$R_{C(ric)} \rightarrow \frac{R_s}{wL} L_t^2.$$

On the other hand, for contact widths higher than $2L_t$, the contact resistance approaches the quantity $$\frac{R_s}{2L} L_t$$

as $$\coth\left(\frac{w}{2L_t}\right)$$

tends to 1.

As seen, the widths of the bus bars in FIG. 1 cannot be made too small or else the contact resistance will be too high, yet narrow widths are desirable to block less light.

Therefore, it would be desirable to reduce the contact resistance between a metal shunting layer and the current spreading layer without adversely impacting the light extraction of the LED die. Conversely, it would be desirable to increase the light extraction of the LED die without reducing the contact resistance between a metal shunting layer and the current spreading layer. It is also desirable to improve the current distribution uniformity across the surface of the LED die.

SUMMARY

Various metal shunting patterns are disclosed herein that reduce contact resistance and improve current distribution uniformity without reducing light extraction.

In one embodiment, the shunting pattern comprises an array of metal circular dots having diameters that are wider than the widths of conventional bus bars and cross bars, but are on the order of $2L_t$-$10L_t$ so as not to block a significant amount of light. In one embodiment, the radius of each dot is greater than $2L_t$ and less than $10L_t$, and preferably less than $5L_t$. The total dot area is less than the total area of the prior art bus bars and cross bars, so there is less blockage of light. Shapes other than circular dots can be used, such as polygons (e.g., squares and rectangles). All such shapes are referred to herein as dots.

In one embodiment, the widths of the dots (between $2L_t$ and $10L_t$) are about 15 microns for the typical metals used and current spreading layer used, in order to ensure low contact resistance. Each dot represents a current injection area. Typically, there would be a density of 50-60 discrete injection areas per square millimeter for good current distribution. For a minimum $2L_t$ width and 50 square dots per $mm^2$, the top surface area of an LED die will have about 1% of its surface covered by the dots. For a large die of 1 $mm^2$, the total area of the dots will be about 0.01 $mm^2$. In one embodiment, the top surface area of an LED die covered by the dots is preferably less than 5%.

To cause the current to be evenly distributed over the top surface of the LED, the dots are connected with a grid of very thin metal connectors, where the contact resistance between the metal connectors and the current spreading layer is relatively high, due the width of the connectors being much less than $2L_t$, but has little effect on current injection since the current is being injected by the dots.

As a result of the dot array, there is a lower overall contact resistance and less light blockage, thus improving the efficiency of the LED.

In one embodiment, a wire bond electrode is formed near the middle of the top surface of the LED to create a more uniform current distribution.

In one embodiment, in addition to the array of dots being interconnected by a grid of thin metal connectors, some dots are also connected to the wire bond electrode with radially extending thin metal connectors to cause the connection resistances between the dots and the wire bond electrode to be more uniform.

In one embodiment, the dots are formed larger as the dots are located further from the wire bond electrode to create more uniform current distribution over the entire surface of the LED.

In one embodiment, the dots are spaced closer and closer together as they extend away from the wire bond electrode to create more uniform current distribution.

In one embodiment, there is a dielectric between the wire bond electrode and the current spreading layer to reduce current crowding under and around the periphery of the wire bond electrode.

In an alternative embodiment, and in order to avoid the use of a dielectric layer between the wire bond electrode and the current spreading layer, a concentric shunting ring surrounding the wire bond electrode at a certain distance is used to reduce current crowding under and around the periphery of the wire bond electrode.

In an embodiment where there is a shunting bar that extends around the periphery of the top surface of the LED, the width of the bar is reduced near the corners to reduce or eliminate current crowding near the corners.

In one embodiment, an angled mirror structure is formed beneath each dot and connecting grid, The mirror below each dot and connector not only reflects light away from the absorbing underside of each dot/connector but also avoids any current crowding directly below each dot (and to a lesser extend below each connector) by causing the active layer below each dot to not generate light. In one embodiment, each mirror is formed in a trench that extends through the active layer below each dot and connector.

Other embodiments are described.

BRIEF DESCRIPTION OF THE DRAWINGS

FIG. 8 is a top down view of the top surface of an LED showing a metal shunting pattern having dots that increase in density as the dots are located further and further away from the wire bond electrode.

FIG. 9 is a top down view of the top surface of an LED showing a metal shunting pattern having square dots and an enlarged center wire bond dot.

FIG. 10 is a cross-sectional view of the wire bond electrode area having an underlying dielectric layer to avoid current crowding under the electrode.

FIG. 12 is a top down view of the top surface of a prior art LED die showing a metal shunt that goes around the periphery of the top surface, similar to FIG. 1.

FIG. 13 is a magnified top down view of the corner of an LED die showing how current crowding near the corner can be avoided by reducing with width of the shunt at the corner. The same technique would be used at the corners of any crossing bus bars.

Elements that are the same or equivalent are labeled with the same numeral.

DETAILED DESCRIPTION

Figure 2:
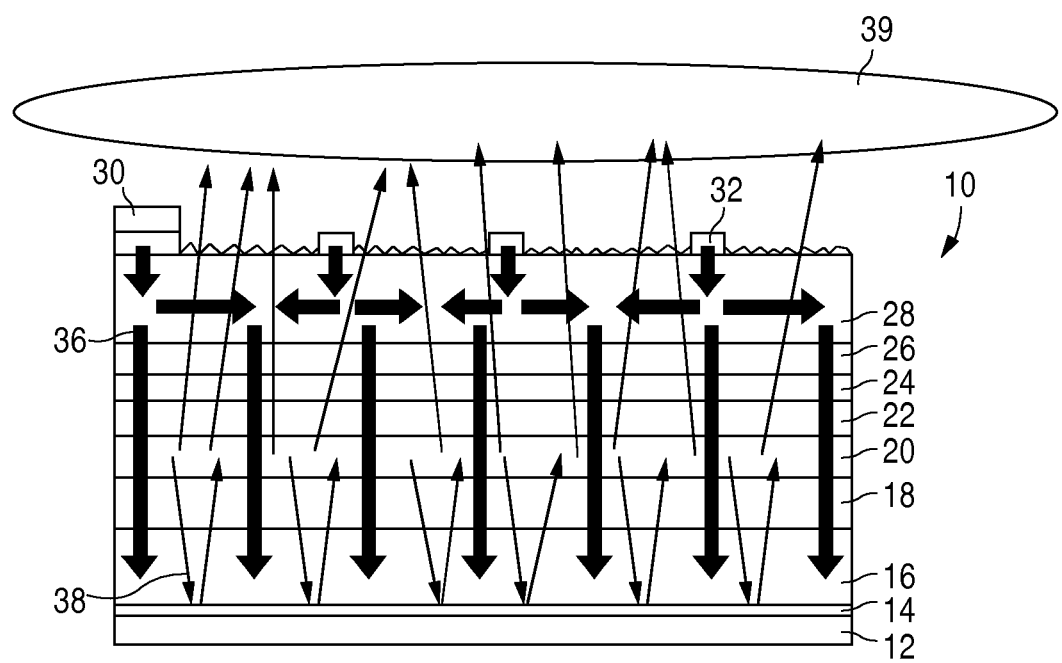
FIG. 2 is a cross-sectional view along line 2-2 in FIG. 1.
Figure 4:
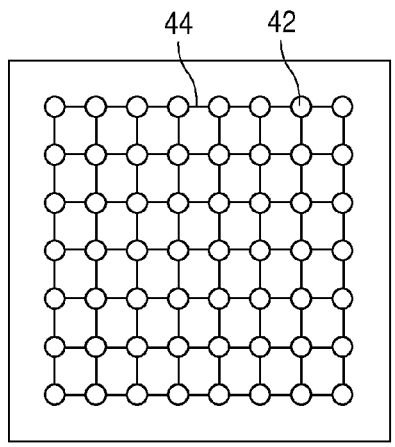
FIG. 4 is a top down view of the top surface of an LED showing a metal shunting pattern in accordance with one embodiment of the invention.

FIG. 4 illustrates one embodiment of a metal shunting pattern 40 on the top surface of an LED die, in accordance with one embodiment of the invention. The LED die may have the same layers as the prior art LED die in FIG. 2.

According to equation 1 above, one way to control the location of current injection into the semiconductor along the bus bar is by means of properly adjusting the geometric parameter w. Circular contacts 42 (dots) are preferred due to their substantially uniform current pattern. The contact resistance of a circle contact of radius $r_c$ can be expressed as follows, $$R_{C(cc)} = \frac{R_s}{2\pi \cdot r_c} \cdot L_t \cdot \frac{I0\left(\frac{r_c}{L_t}\right)}{I1\left(\frac{r_c}{L_t}\right)} \qquad \text{eq. 3}$$

In equation 3, I0 and I1 are the modified Bessel functions of the first and second kind, respectively. Like in the case of the bus bar, the contact resistance of a circle contact increases dramatically for $r_c < 2L_t$. Therefore, in the preferred embodiment, the radius of each circular contact is between about $2L_t$ to $10L_t$.

Accordingly, a shunting layer pattern may consist of a number of geometric shapes whose characteristics allow to selectively control the locations of current injection but are limited in size to not adversely affect light output. This can be applied, for instance, to improve current uniformity through the active layer of the device with minimum metal-semiconductor contact area.

Narrow metal connectors 44 are arranged in a grid to connect the contacts 42 together. The connectors 44 have widths preferably less than $2L_t$ since they are not required to inject current into the LED, and wider connectors will increase the blockage of light.

The contacts 42 and connectors 44 preferably are a multilayer composition of metals that provide low resistance yet do not migrate into the semiconductor layers.

Figure 5:
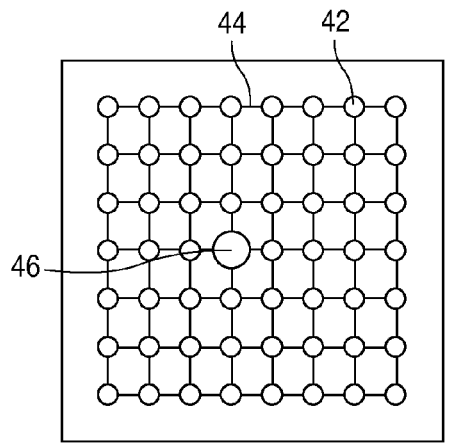
FIG. 5 shows the shunting pattern of FIG. 4 with a relatively large wire bond electrode located near the middle of the LED die surface for substantially uniform current distribution.

FIG. 5 shows the shunting pattern of FIG. 4 with a relatively large wire bond electrode 46 located near the middle of the LED die surface for substantially uniform current distribution. The size of the electrode 46 is preferably a minimum size to achieve a good wire bond.

Figure 6:
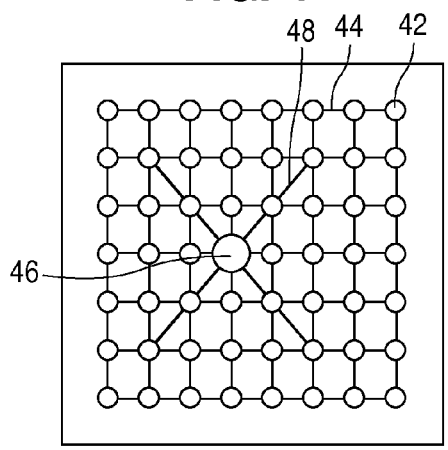
FIG. 6 shows the shunting pattern of FIG. 5 with additional radial connectors between the wire bond electrode and various dots.

FIG. 6 shows the shunting pattern of FIG. 5 with additional radial connectors 48 between the wire bond electrode 46 and various contacts 42. These radial connectors 48 provide a parallel connector path to the outer contacts 42 for more uniform current distribution, since the combined resistances of the grid connector 44 paths increase from the wire bond electrode 46.

Figure 7:
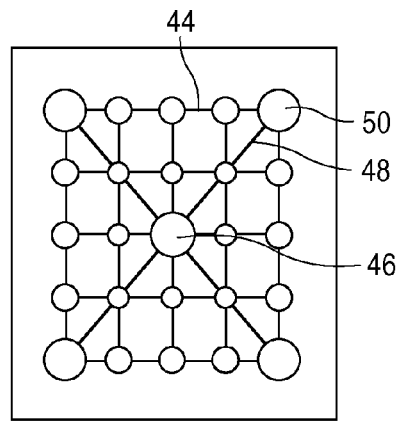
FIG. 7 is a top down view of the top surface of an LED showing a metal shunting pattern having dots that increase in size as the dots are located further and further away from the wire bond electrode.

FIG. 7 is a top down view of the top surface of an LED showing a metal shunting pattern having contacts 50 that increase in size (diameter) as the contacts 50 are located further and further away from the wire bond electrode 46. The larger area contacts inherently reduce the space between contacts near the perimeter, this increasing the current injection near the perimeter to offset the increased resistance of the connectors 44 and 48 leading to the outer contacts 50.

FIG. 8 is a top down view of the top surface of an LED showing a metal shunting pattern having contacts 54 that increase in density as the contacts 54 are located further and further away from the wire bond electrode 46 to achieve a more uniform current density.

FIG. 9 is a top down view of the top surface of an LED die 55 showing a metal shunting pattern having square dots 56, an enlarged center wire bond dot 57, and narrow connectors 58 connecting the dots. The arrangements and widths of the square dots may be similar to those of the circular dots described above.

Figure 3:
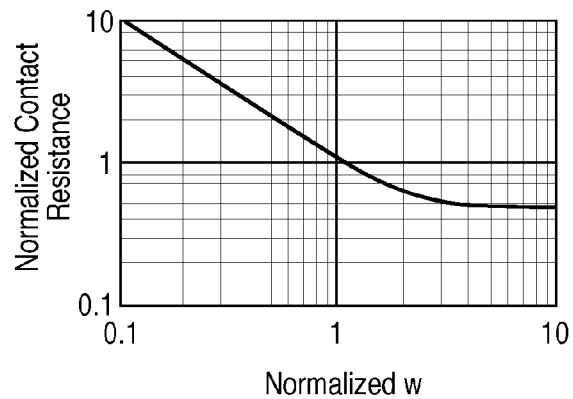
FIG. 3 is a graph of normalized width of a contact and the normalized contact resistance, showing that normalized widths less than $2L_t$ result in higher and higher contact resistances.

In one embodiment, the widths of the dots (between $2L_t$ and $10L_t$) are about 15 microns for the typical metals used and current spreading layer used, in order to ensure low contact resistance (based on a graph similar to FIG. 3 for the particular materials used). Each dot represents a current injection area. Typically, there would be a density of 50-60 discrete injection areas per square millimeter for good current distribution. For a minimum $2L_t$ width and 50 square dots per mm², the top surface area of an LED die will have about 1% of its surface covered by the dots. For a large die of 1 mm², the total area of the dots will be about 0.01 mm². Circular dots of the same width as square dots cover less area, so would block less light. In one embodiment, the top surface area of an LED die covered by the dots is preferably less than 5%, such as 2%. Widths of the dots less than $5L_t$ but slightly greater than $2L_t$ are preferred, since widths greater than $2L_t$ do not provide significantly reduced contact resistance, and light blockage should be minimized.

FIG. 10 is a cross-sectional view of the wire bond electrode 46 area having an underlying dielectric layer 64 to avoid current crowding under and around the periphery of the electrode 46. The metal contacts the current spreading layer 28 with a ring having a width Wx. Wx is preferably $0.5L_t < Wx < L_t$. Also shown is a wire 60 and bond metal 62.

Figure 11:
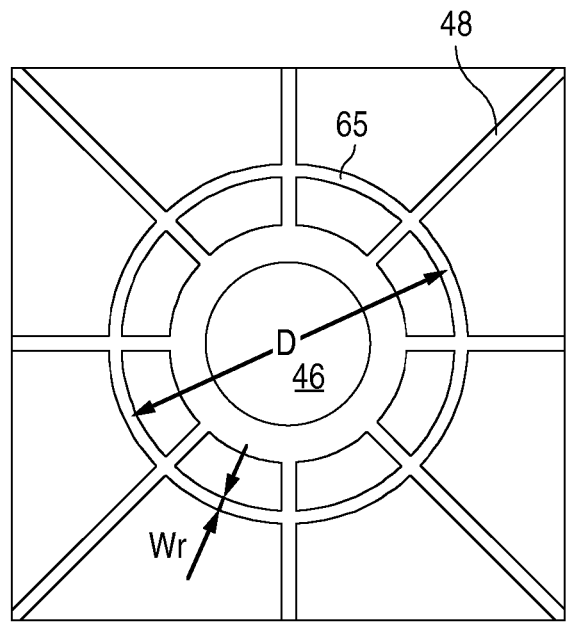
FIG. 11 is a top down view of the top surface of an LED showing a metal shunting ring pattern that surrounds the wire bond electrode to mitigate current crowding under and around the periphery of the wire bond electrode.

FIG. 11 shows a concentric shunting ring 65 surrounding the wire bond electrode 46 at a certain distance. The shunting ring 65 reduces current crowding under and around the periphery of the wire bond electrode 46. The width (Wr) of the shunting ring 65 is proportional to $L_t$, preferable higher than $0.1L_t$ and lower than $L_t$, to provide an adequately low current resistance. The diameter (D) of the ring 65 is preferably at least 20% larger than the diameter of the wire bond electrode 46.

Figure 1:
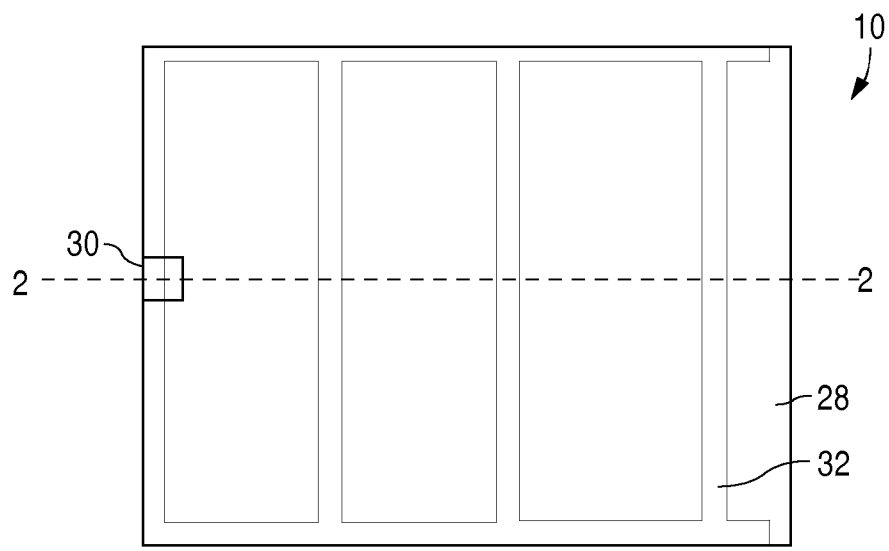
FIG. 1 is a top down view of a top surface of a prior art LED die showing a metal shunting pattern.

FIG. 12 is a top down view of the top surface of a prior art LED die showing a metal shunt 66 that goes around the periphery of the top surface of the LED, similar to FIG. 1, with a wire bond electrode 68 near one corner. Due to the arms of the shunt 66 approaching each other at each corner, there will be current crowding near the corners, resulting in non-uniform light output and perhaps an over-current in those areas. To substantially prevent such current crowding in the corners, the metal shunt configuration of FIG. 13 may be used.

FIG. 13 is a close up of one corner of an LED die, showing that the metal shunt 70 has a reduced width Wc in the corners to reduce the current injection from each arm near the corner. Wc is preferably less than $L_t$ (e.g., $0.1L_t$) to increase the contact resistance needed to create a substantially uniform current distribution near the corner. The width of the remaining part of the shunt is greater than $L_t$. Unlike the inner contacts, in the edge contacts, current flows from only one side of the contact area and hence the $2L_t$ minimum width does not apply here. A wire bond electrode is preferably located midway along a shunt arm to avoid current crowding near a corner. Each corner will be similar to FIG. 13.

The same technique would be used at the corners of any crossing bus bars.

The contacts 42, 50, 56 in the middle area of the LED die are connected to the metal shunt 70 using the narrow connectors 44, 48 previously described.

Figure 14:
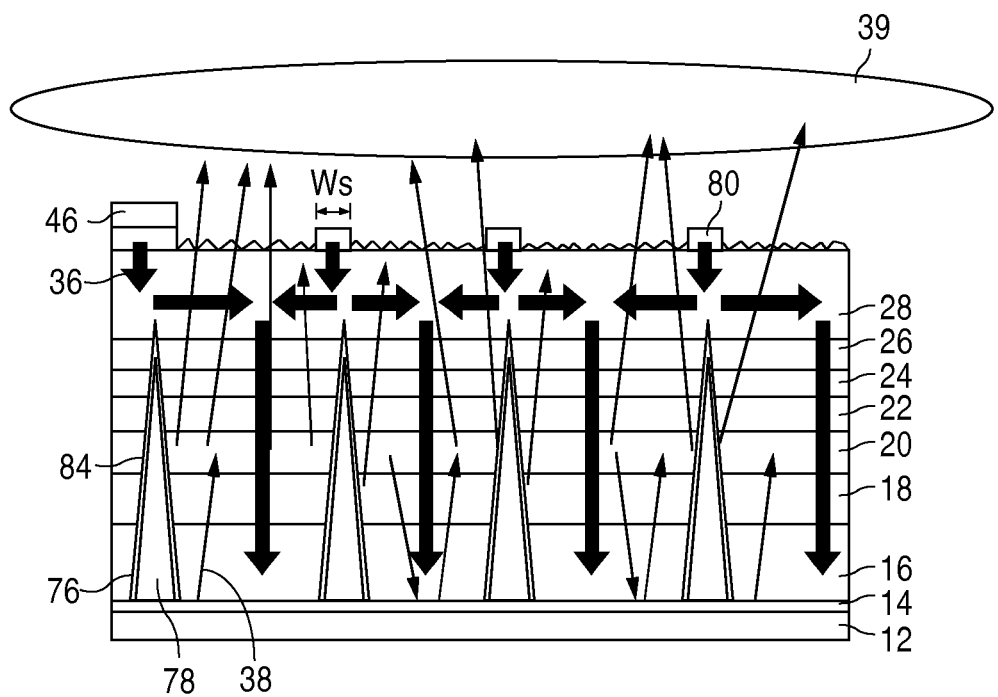
FIG. 14 is a cross-sectional view of an LED die in accordance with one embodiment of the invention, where angled mirrors are formed in trenches below each dot.

FIG. 14 is a cross-sectional view of an LED die in accordance with one embodiment of the invention, where angled mirrors 76 are formed in trenches 78 below each circular contact 80 and grid connector. The mirrors 76 reduce the blockage of light by the overlying circular contacts 80 and connectors and prevent the creation of high current density regions below each circular contact 80 and to a lesser extent below the connectors. Details regarding the formation of such mirrors 76 are found in U.S. application Ser. No. 12/770,550, by Rafael Aldaz, filed on 30 Apr. 2010, incorporated herein by reference.

The geometric shapes of the mirrors 76 may be tailored to enhance light extraction efficiency. This is provided that the top contacts 80 (similar or identical to any of the contacts described previously) can be combined with the use of mirror walls located in the semiconductor underneath the contacts 80, as depicted in FIG. 14. The illustration shows a case where the mirror 76 (usually a metal) penetrates into the semiconductor and crosses the active layer 20 in the regions underneath the contacts 80. To prevent electrical shorts between layers, the mirror 76 is covered with a transparent dielectric 84. The population within the chip of these mirror walls enhances light extraction in detriment of reducing active area where photons generate. Because of this trade-off, it is preferable that the width Ws of each contact 80 is minimized and hence the number of mirrors maximized. This, in turn, translates into the minimization of the distance between mirrors that maximizes light extraction.

Preferably, the pattern of the shunting layer should be designed to optimize the following performance related aspects:
  Uniform current injection into the semiconductor active layer (e.g., control distribution of contacts)
  Minimization of voltage drop across the shunting layer (e.g., use thin metal connectors)
  Maximization of light extraction (e.g., optimize size of contacts and form mirrors)
  Maximization of active area (e.g., optimize size of mirrors)

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting diode (LED) device comprising:
   an LED die comprising a light emitting semiconducting layer epitaxially grown over a growth substrate and extending substantially entirely across the LED die, the LED die having a top surface comprising a current spreading layer covering the semiconductor layer; and
   a metal electrode pattern on only a portion of the top surface for conducting current through the LED for energizing the LED, the electrode pattern comprising:
      a plurality of opaque metal contacts over the top surface having widths between about 2 and 10 times a transfer length $L_t$ of the contacts, where the transfer length is defined as, $$L_t = \sqrt{\frac{\rho_c}{R_s}},$$

wherein $R_s$ is the sheet resistance in ohms per square of the current spreading layer, and $\rho_c$ is the contact resistivity of the interface of the contact and the current spreading layer expressed in ohm·m²,
      wherein the opaque metal contacts block light emitted by the light emitting semiconducting layer; and
      metal connectors connecting ones of the contacts together, the metal connectors having widths less than $2L_t$.

2. The device of claim 1 wherein the plurality of metal contacts over the top surface have widths between about 2 and 5 times a transfer length $L_t$ of the contacts.

3. The device of claim 1 wherein a total area of the contacts is less than 2% of a light emitting surface of the LED die.

4. The device of claim 1 wherein a total area of the contacts is less than 5% of a light emitting surface of the LED die.

5. The device of claim 1 wherein a total area of the contacts is less than 10% of a light emitting surface of the LED die.

6. The device of claim 1 wherein the contacts are substantially circular, and the widths are diameters of the contacts.

7. The device of claim 1 wherein the contacts are polygons.

8. The device of claim 1 further comprising a wire bond electrode connected to the contacts by at least one of the metal connectors.

9. The device of claim 8 wherein the metal connectors form a grid of parallel and perpendicular connectors.

10. The device of claim 8 wherein the metal connectors radially extend from the wire bond electrode.

11. The device of claim 8 wherein at least some of the contacts increase in size as the contacts are further from the wire bond electrode.

12. The device of claim 8 wherein a density of the contacts increase as the contacts are further from the wire bond electrode.

13. The device of claim 8 further comprising a dielectric layer between the wire bond electrode and the current spreading layer to reduce a current density between the wire bond electrode and the current spreading layer.

14. The device of claim 13 wherein the wire bond electrode extends over an edge of the dielectric layer by a distance Wx around the dielectric layer, wherein $0.5L_t < Wx < L_t$.

15. The device of claim 8 further comprising a concentric shunting ring surrounding the wire bond electrode at a certain distance to reduce current crowding under and around a periphery of the wire bond electrode, wherein there are no metal contacts between the shunting ring and the wire bond electrode.

16. The device of claim 15 wherein a width of the shunting ring is between $0.1L_t$ and $L_t$, and wherein a diameter of the shunting ring is at least 20% larger than a diameter of the wire bond electrode.

17. The device of claim 1 further comprising a metal shunt around a perimeter of the LED die top surface, the shunt having a first width along edges of the die and a narrower width at corners of the die for reducing current density at the corners of the die.

18. The device of claim 17 wherein the first width of the shunt along the edges of the die is larger than $L_t$, and the narrower width of the shunt at the corners of the die is less than $0.1L_t$ for reducing current density at the corners of the die.

19. The device of claim 1 wherein the growth substrate has been removed.

* * * * *